April 21, 1970 J. L. McLAUGHLIN 3,507,592

METHOD OF FABRICATING PHOTOMASKS

Filed Oct. 28, 1968

INVENTOR.
JOSEPH L. McLAUGHLIN
BY Michael Y. Epstein
Attorney 3,507,592
METHOD OF FABRICATING PHOTOMASKS
Joseph L. McLaughlin, Flemington, N.J., assignor to RCA Corporation, a corporation of Delaware
Continuation-in-part of application Ser. No. 557,425, June 14, 1966. This application Oct. 28, 1968, Ser. No. 780,304
Int. Cl. G03b 27/32
U.S. Cl. 355—77 5 Claims

ABSTRACT OF THE DISCLOSURE

Improved photomasks are provided comprising a transparent substrate having first and second spaced surfaces. Each surface is provided with an opaque image, the images being in optical registry with one another, and the images, in the fabrication of the photomasks, being provided independently of one another.

This is a continuation-in-part of co-pending application Ser. No. 557,425, filed June 14, 1966, entitled "Improved Photomasks," and now abandoned.

BACKGROUND OF THE INVENTION

This invention relates to photomasks used in the manufacture of semiconductor devices. The photomasks of the invention have particular utility in the contact photographic printing of photoresist patterns on semiconductor wafers, and in applications wherein photomasks having an extremely high degree of accuracy and a low level of defects are required.

According to one method of manufacturing semiconductor devices, a semiconductor wafer is coated with a photosensitive material, and a negative of an image on a photomask is then duplicated on, or "printed" onto the wafer by exposing the photosensitive coating to a source of light through the photomask and then developing the coating. If the photomask is placed in contact with the photosensitive coating, the process is known as "contact" printing. If the photomask is maintained spaced from the coating, the process is known as "projection" printing.

In the contact printing process, the surface of the photomask having the opaque image is usually pressed firmly against the photosensitive coating on the wafer. This is to improve the faithfulness of the image transferred to the coating. The surface of the photosensitive coating, however, is not smooth, and the material on the surface of the photomask of which the photomask image is constituted is frequently scratched by contact therewith. The scratched photomasks often must be repaired before they can be reused, or, in many cases, must be discarded. In either event, the damage to the photomask caused by surface scratching thereof gives rise to a significant expense in the manufacture of semiconductor devices.

Further, regardless of whether the photomasks are used in contact or projection printing, a great need exists for photomasks having greater accuracy and reduced defects.

SUMMARY OF THE INVENTION

Improved photomasks are provided comprising a transparent substrate having first and second spaced surfaces. Each surface is provided with an opaque image, the images being in optical registry with one another, and the images, in the fabrication of the photomasks, being provided independently of one another.

DESCRIPTION OF PREFERRED EMBODIMENTS OF THE INVENTION

Figure 1:
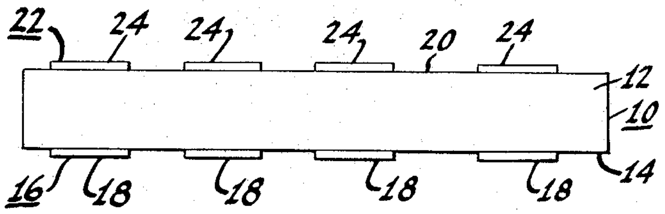
FIGURE 1 is a side elevation of the improved photomask.
Figure 2:
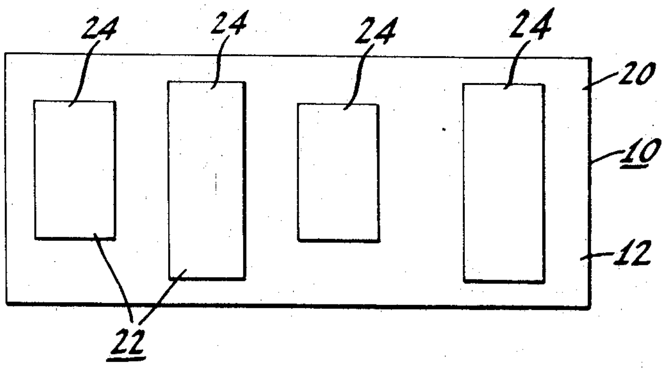
FIGURE 2 is a plan view of the photomask shown in FIGURE 1.

With reference to FIGURES 1 and 2, a photomask 10 is shown comprising a substrate 12 of a transparent material such as glass. On one surface 14 of the substrate 12 is provided an opaque image 16 comprising four opaque elements 18. The four-element image 16 shown is for illustrative purposes only. Photomask images, as known, usually comprise a large number of opaque elements.

The opaque elements 18 are formed from deposits or layers of a known opaque material, such as chrome, exposed and developed photographic emulsions, screening ink, or the like. As shown, the elements 18 form a relief or raised pattern above the surface 14 of the substrate 12. The elements 18 have a thickness in the order of 1000 A.

Alternately, although not shown, the surface 14 of the substrate 12 can be provided with shallow recesses, as by etching, conforming in shape to the outline of the elements 18. The element 18 material is placed in the recesses to provide an image 16 flush with the external surface 14 of the substrate 12.

The provision of an opaque image 16 of the types described on a substrate is presently well known. For example, to provide an image 16 of the type shown in FIGURE 1 on the substrate 12, the surface 14 thereof is first covered with a thin layer of chromium. The chromium layer is then covered with a thin coating of a photosensitive material, such as Kodak Photo Resist, and the photosensitive material coating is exposed through an image defining means such as, for example, a "master" photomask having the image 16 thereon. The master photomask can be made, for example, by photographic reduction and printing of a handmade drawing of the image 16. The exposed photosensitive coating is then developed and the unexposed portions thereof are removed, as by known processes, thus exposing portions of the underlying chromium layer. The exposed chromium layer portions are then removed, as by etching. The remainder of the developed photosensitive material is then removed, as by known processes, leaving the image 16 formed from opaque chromium elements.

On the surface 20 of the substrate 12, opposite to the surface 14, is provided an opaque image 22 identical to the opaque image 16 on the surface 14. The image 22 comprises four opaque elements 24.

For convenience, the surface 14 and the image 16 may be referred to as the primary surface and primary image, and the surface 20 and image 22 may be referred to as the back-up surface and back-up image.

The two images 16 and 22 are in optical registry with one another. By optical registry is meant that with a light source on the back-up surface 20 side of the substrate 12, the shadows cast by the opaque elements 24 of the image 22 fall entirely within the outlines of the corresponding opaque elements 18 of the image 16. If the light rays from the source are substantially perpendicular to the surface 20, the images 16 and 22 can be substantially identical, as illustrated in FIGURES 1 and 2, and the shadows cast by the elements 24 thus conform substantially exactly in size and shape to the elements 18. Conversely, if the light rays from the source are slightly diverging, the elements 24 of the image 22 are made slightly undersize, in comparison to the elements 18 of the image 16, in order that the shadows from the elements 24 fall within the outlines of the elements 18.

Fabrication of the back-up image 22 can be accomplished, for example, in the same manner as the fabrication of the primary image 16, but in a separate operation, for a reason described hereinafter. Known alignment means are used to align the substrate 12 with the master photomask in such manner that the back-up image is formed on the surface 20 in optical alignment with the primary image 16 on the surface 14 of the photomask. In a preferred embodiment, different master photomasks are used to form the two images 16 and 22, for a reason described hereinafter.

Although not shown, either or both the primary image 16 and the back-up image 22 can be formed within recesses in their respective surfaces 14 and 20.

In the use of the photomask 10, the primary surface 14 having the primary image 16 thereon is placed against a coating of photosensitive material disposed on the surface of a semiconductor wafer. The photosensitive coating is exposed through the photomask by a light source on the back-up surface 20 side of the photomask. A negative reproduction of the primary image 16 is "printed" on the photosensitive coating on the semiconductor wafer. Since the shadow of the back-up image 22 falls entirely within the outlines of the opaque elements 18 of the primary image 16, the presence of the back-up image 22 has no affect upon the exposure of the wafer.

However, should the primary image 16 be scratched, that is, if portions of the opaque material of the elements 18 be scraped away, the scraped-away transparent portions are shadowed from the exposing radiation source by the back-up image elements 24. Thus, the presence of the scratches does not affect the utility of the photomask. The back-up image 22, being spaced from the semiconductor wafer surface, is not subject to scratching. Thus, even if scratching of the photomask 10 occurs, the useful life of the photomask is greatly extended by the presence of the back-up image.

Figure 3:
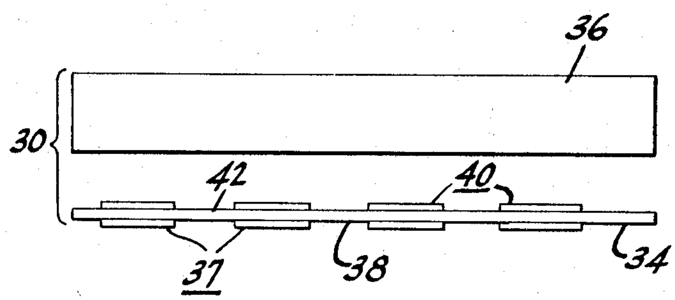
FIGURE 3 is an exploded side elevation of a different embodiment of the improved photomask.

With reference to FIGURE 3, a photomask 30 is shown comprising an image-bearing substrate 34 and a support plate 36. Both the substrate 34 and the plate 36 are of transparent material such as glass. The substrate 34 is provided with a primary image 37 on a primary surface 38 of the substrate 34, and a back-up image 40 on a back-up surface 42 of the substrate 34. For a reason described hereinafter, the two images 37 and 40 are preferably formed using different image defining means, i.e., different master photomasks, or the like. The substrate 34 is quite thin, the thickness thereof being in the order of 0.005 inch. The closer the primary and back-up images 37 and 40, respectively, are to one another, the finer is the image resolution obtainable with photomasks using such dual images. For reasons of greater mechanical strength, the substrate 34 is bonded to the thick plate 36. The bonding may be accomplished using known means, such as transparent glass frit, glass epoxy, lens cement, or the like. In one embodiment, the plate 36 has a thickness of 60 mils.

Figure 4:
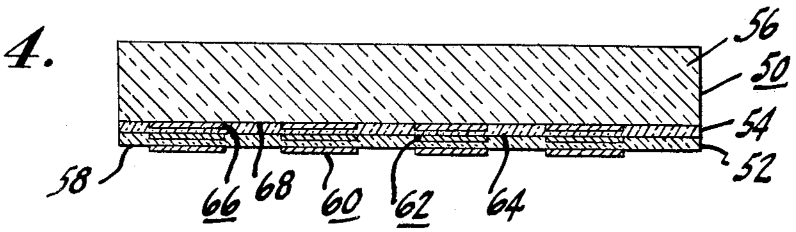
FIGURE 4 is a sectional view through a further embodiment of the improved photomask.

With reference to FIGURE 4, a photomask 50 is shown comprising a first substrate 52, a second substrate 54, and a plate 56, all of a transparent material such as glass. The surface 58 of the substrate 52 is provided with a primary image 60. A back-up image 62 is provided on the surface 64 of the substrate 54, and a second back-up image 66 is provided on the surface 68 of the plate 56. The three images 60, 62, and 66 are in optical registry.

In the manufacture of the photomask 50, the plate 56, prior to the addition of the substrates 52 and 54 thereto, is provided with the back-up image 66 on the surface 68 thereof. The substrate 54 is then formed on the surface 68 and on the image 66 by, for example, a vapor deposition process.

The material of the substrate 54, as well as that of the substrate 52, is resistant to the various chemicals used in the formation of the images 60 and 62. Thus, an image once formed is unaffected by the formation of subsequent images. An advantage of this is described hereinafter.

Methods for depositing suitable transparent materials are known. For example, the substrate 54 can comprise silicon dioxide ($SiO_2$) formed by cracking silane ($SiH_4$) vapor by heating the silane in oxygen in the presence of the plate 56. The back-up image 62 is then formed on the surface 64 of the substrate 54. The substrate 52 is then formed on the surface 64 and the image 62 thereon. Lastly, the primary image 60 is formed on the surface 58 of the substrate 52. Preferably, different photomasks are used in the formation of each of the images 60, 62, and 66. An advantage of this is described hereinafter.

In another embodiment, not shown, the intermediate substrate 54 of the photomask 50 is omitted, the substrate 52 being formed directly on the plate 56 and the image 66 thereon.

While the primary image, in the usual instance, is provided on a surface, i.e., the "outside" of the photomask substrates, in some instances, the primary image can be coated with a thin protective layer of a transparent material such as glass.

Advantages of the photomask 50 are as follows. Using the techniques described, the substrates 52 and 54 can be made extremely thin, e.g., in the order of 5000 A. This close spacing between the images contributes to the obtaining of highly accurate, fine dimension image element photomasks. For example, in the fabrication of photomasks of the type herein described, known alignment means, as previously noted, are used to align an image being formed on one surface of the photomask with an image previously formed on another surface of the photomask. As a practical matter, the alignment process is greatly facilitated, and performed with higher accuracy, if the surface on which the image is to be formed and the surface containing the previously formed image can be simultaneously viewed. This provides a direct comparison of the alignment of the two images. A problem, however, is that the smaller and finer the details of the images, the greater is the amount of magnification which must be employed in the alignment process, and the smaller is the depth of focus of the magnifying apparatus. Thus, with images having extremely fine and small details, great difficulty is encountered in the fabrication of the photomasks unless the surfaces on which the images are to be disposed are extremely close to one another. Because the images 60, 62, and 66 of the photomask 50 can be disposed very close to one another, as noted, photomasks 50 having images with extremely fine details can be readily and accurately made.

Additionally, as described, each image 60, 62, and 66 if formed substantially independently of the other images by virtue of the substrates 52 and 54 being provided on a completed image prior to the formation of a subsequent image. Likewise, in the fabrication of the photomasks 10 and 30, the various images are formed independently on opposite surfaces of a substrate. Additionally, although not necessarily, each image of the various photomasks 10, 30, and 50 is preferably made using a different photomask. The effect of the independent formation of the various images is that defects in one image are not likely to be repeated in the other images. In the completed photomask, any defects or openings in the opaque elements of one image are masked by the corresponding elements in another image or images.

Thus, photomasks having an extremely high degree of quality are obtainable in accordance with the present invention.

What is claimed is:

1. A method of fabricating a photomask comprising:
forming, by light projection through a first image defining transparency, a first opaque image on a first surface of a transparent substrate; and, using a different image defining transparency and without affecting said first image, forming a second opaque image substantially identical in size and shape to said first image and in optical registry therewith on a second surface of said substrate spaced from said first surface.

2. A method of fabricating a photomask comprising:
forming a first opaque image element on a first surface of a transparent substrate;
coating said first surface and said first image element with a transparent substance; and
thereafter, without affecting said first image element, forming a second opaque image element substantially identical in size and shape to said first image element and in optical registery therewith on a surface of said transparent substance spaced from said first surface.

3. A method as in claim 2 wherein said substance is vapor deposited onto said first surface and said first image element to a thickness in the order of 5000 angstroms.

4. A method as in claim 2 wherein said first and second image elements are formed using different image defining transparencies.

5. A method as in claim 3 wherein said first and second image elements are formed using different image defining transparencies.

References Cited

UNITED STATES PATENTS

| | | | |
|---|---|---|---|
| 1,508,916 | 9/1924 | Brewster | 95—12.20 X |
| 3,041,930 | 7/1962 | Davidson | 95—4.5 X |

NORTON ANSHER, Primary Examiner
R. A. WINTERCORN, Assistant Examiner

U.S. Cl. X.R.

95—12; 355—26, 40, 125